United States Patent [19]
Baitinger et al.

[11] 3,986,173
[45] Oct. 12, 1976

[54] MEMORY CIRCUIT

[75] Inventors: Utz Baitinger, Stuttgart; Knut K. Najmann, Gaertringen; Werner Haug, Boeblingen, all of Germany

[73] Assignee: International Business Machines Corporation, Armonk, N.Y.

[22] Filed: Oct. 8, 1975

[21] Appl. No.: 620,690

[30] Foreign Application Priority Data
Dec. 19, 1974 Germany............................ 2460150

[52] U.S. Cl. .................... 340/173 R; 340/173 FF; 307/238; 307/290; 357/43
[51] Int. Cl.² .................. G11C 11/40; G11C 13/00
[58] Field of Search .................. 340/173 R, 173 FF; 307/238, 279, 290; 357/43

[56] References Cited
UNITED STATES PATENTS
3,747,078 7/1973 Rose.............................. 340/173 FF
3,849,675 11/1974 Waaben ......................... 340/173 FF
3,879,621 4/1975 Cavaliere ...................... 340/173 FF

*Primary Examiner*—Terrell W. Fears
*Attorney, Agent, or Firm*—Francis J. Thornton

[57] ABSTRACT

A semiconductor storage circuit for use in monolithic memories. The circuit is comprised of a storage cell coupled to input-output bit lines through active devices having symmetrical conduction properties. The storage cell can be comprised of a pair of cross coupled bipolar transistors having resistors as collector load devices. Schottky field effect transistors (MESFET's) are active devices having symmetrical conduction properties.

The entire circuit of the invention is readily created in integrated form in semiconductor wafers using existing processes.

8 Claims, 8 Drawing Figures

MEMORY CIRCUIT

BACKGROUND OF THE INVENTION

1. Field of the Invention

The invention relates generally to a monolithically intergratable storage circuit with storage cells which comprise cross coupled bipolar transistors and addressing elements for storage selection coupled to said bipolar transistors.

2. Description of the Prior Art

In electronic data processing systems binary coded data which has been received from logic circuits, or which is to be processed, as input data, or intermediate or final results has to be continuously stored. Storage devices, for example, tape and disk storages, offer a high storage capacity, but demand a relatively high access time. Thus there is need for high speed storage of medium capacity with comparatively low access time. These high speed storage arrangements can be realized with bistable or capacitively storing electronic circuits. Of the technically possible circuits the monolithically integratable semiconductor circuits are at present particularly attractive, economical factors being not the least important reason. For static storage cells formed in this technology flipflops are particularly used and can maintain their storage contents until altered through a writing process. Semiconductor technology permits the monolithic integration of comprehensive storage circuits or matrices by forming on a common semiconductor chip a multitude of such flipflops geometrically arranged in rows and columns. For the selection of the individual storage cells the semiconductor chips additionally contain the necessary logic circuits, e.g. decoders.

Static flipflop storage cells have already been developed in many versions in accordance with the predominant points of view as capacity, access time, power dissipation, packing density, manufacturing process, etc. Flipflop storage cells which are structured exclusively with bipolar or field effect transistors of a uniform or mutually complementary conductivity type also exist. Furthermore, hybrid storage cells with for instance bipolar transistors as flipflop transistors and field effect transistors as the load element, and vice versa are also known. All these versions have advantages and disadvantages, for instance, storage cells structured with complementary transistors have a very low power dissipation, but they involve a relatively complex manufacturing process. The present invention in particular relates to storage circuits whose basic circuits are flipflops with bipolar transistors. Particularly with respect to the storage circuits structured with unipolar or field effect transistors, respectively, the following points of view are decisive in the present case.

As already pointed out above, a storage system can be characterized by its capacity (quantity of contents) and its access time (delivery). The quotient of both factors is an indication for the quality of the storage. If only the storage cells themselves are considered, there actually exist many factors in favor of designing such semiconductor storages with field effect transistors for, with respect to bipolar transistors, they offer a higher packing density with a generally lower permanent power dissipation. However, logic circuits also have to be provided in large members in such a data processing system and here bipolar transistor circuits offer clearly superior properties compared with field effect transistor circuits, particularly with respect to their switching speed. Although the storage cells and the logic circuits can be separately assembled, there are limitations with respect to the number of the external connections that can be made between a semiconductor chip containing storage cells and the logic circuits required for decoding the storage cells. In a storage matrix with $2^n$ rows and $2^m$ columns which consequently contains $2^{n+m}$ storage cells $2^n$ word lines and $2^m$ bit line pairs have to be provided for the selection of a storage cell. It is obvious that the selection of word and bit in modern day packing densities can no longer take place directly from the outside as the storage matrix would then require $2^n + 2^m$ external connections at the semiconductor chip. For a matrix of $512 = 2^{4+5}$ storage cells that would be $2^4 + 2^5 = 48$ connections. The storage capacity per semiconductor chip selected for this example is easily obtainable by means of the manufacturing processes available today, and it is by no means an extreme example. If in the given example, however, the decoder circuits are provided on the semiconductor chip only $4 + 5 = 9$ connections are required. Consequently, this shows that with the packing densities obtainable today require the selection circuits to be integrated on the semiconductor chip.

The access time of the respective storage circuit, however, depends not only the access time of the storage cells per se, but also substantially depends on the speed of the selection circuits. For that reason it is the general object of the invention to present a storage circuit with a short access time which offers the advantage of the speed of the bipolar transistors, and which can be realized in a manufacturing process adapted to the making of bipolar transistors, respectively.

A survey of the various known bipolar storage cells reveals that the word line is always connected to the two active flipflop transistors, see e.g. the book "Schaltkreistechnologien fur digital Rechenanlagen", by U. Baitinger, published by Wafter de Gruyter, 1973, pp. 219 to 221, and Elektronics, March 7, 1974, pp. 130 to 133, particularly FIG. 5 on p. 132. A disadvantage of such a coupling of the word line to the active flipflop transistors, however, is that upon selection, i.e. when the potential of the word line is decreased, the two cell nodes also decrease with respect to their potential, and that subsequently to the selection phase, i.e. when the potential of the word line increases again, they have to be recharged which involves a relatively high amount of time or demands an increased current flow, respectively. Regarding the addressing of such storage cells equipped with the bipolar transistors it is furthermore highly desirable to have circuit properties available for the writing and reading process which are of a maximum symmetry, or which are equal, respectively. In the cases of where diodes or transistors are used for the coupling of the cells to the bit line there exists, owing to this respective asymmetrical conduction properties considerable differences for the writing and reading process which result e.g. in relatively high writing currents.

SUMMARY OF THE INVENTION

It is, therefore, the object of the invention to provide a storage circuit with bipolar transistors as active flipflop transistors, which is improved with respect to the above mentioned points, i.e. which maintains the advantage of the speed of the bipolar transistors without having to accept the disadvantage of the "pumping" of the potential of the entire storage cell.

It is a further object to describe a circuit showing more balanced write-read properties.

It is also an object to provide an economical, realizable manufacturing process providing highly integrated circuits.

In accordance with the present invention there is provided monolithically integratable storage cells of the flipflop type in which the active flipflop transistors are bipolar transistors, and the addressing or input/output elements are Schottky field effect transistors, herein after called MESFET. As the MESFET's used as addressing elements are three-terminal elements with symmetrical conduction properties they permit the charging as well as the discharging of the cell nodes as well as control by the selection lines. These MESFET's are produced by standard Schottky bipolar processes. A specific design of the MESFET structures additionally permits, by means of a novel channel control, high speed reading and writing of the storage cell.

The following is a more particular description of the preferred embodiment of the invention as illustrated in the accompanying drawings.

IN THE DRAWINGS

DESCRIPTION OF THE PREFERRED EMBODIMENT

Figure 1:
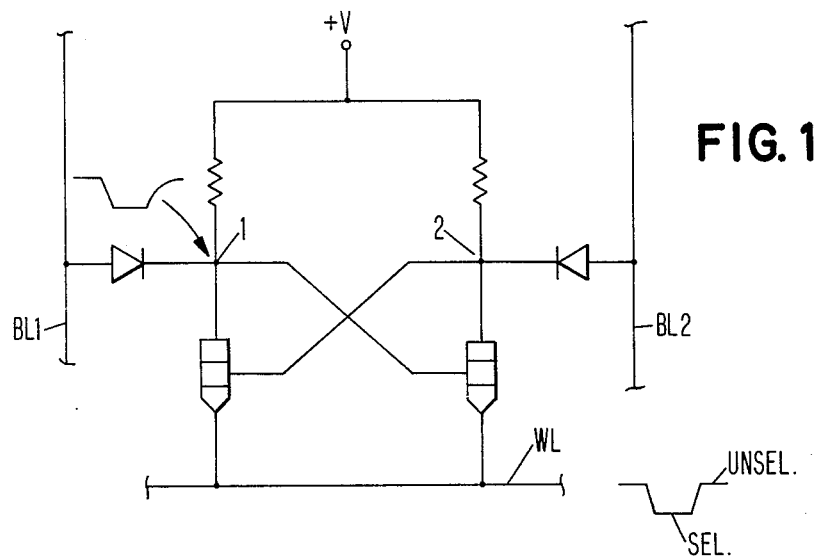
FIG. 1 shows a typical flipflop storage cell with bipolar transistors.

FIG. 1 shows the circuit diagram of a known flip-flop storage cell using two cross coupled bipolar transistors. The interconnected emitters of the two active flipflop transistors are connected to the word line WL. The two cell nodes 1 and 2 of the flipflop are connected to bit lines BL1 and BL2 by means of diode coupling. With respect to its addressing this storage cell can be considered typical for flipflop storages with bipolar transistors in accordance with prior art. The problems of this kind of storage cell which occur in such bipolar storage cells are to be shown by this circuit; when the storage cell is designed in the form as disclosed by the invention these problems do no longer appear.

The first grave problem to be accepted in such storage cells is the disadvantage of the "pumping" of the potential of the entire storage cell, when upon selection the potential of the word line decreases. This automatically causes the decrease of the potential of the two cell nodes 1 and 2. If it is assumed that in FIG. 1 the left-hand flipflop transistor is conductive it is obvious that the potential at cell node 1 can immediately follow the change of potential at the word line, whereas the potential at cell nodes 2 follows the base-emitter diode of the conductive transistor. Upon the termination of the selection, i.e. when the potential of the word line rises again, the two cell nodes 1 and 2 have, to be recharged again via the load resistors as otherwise both flipflop transistors are nonconductive. This requires a relatively long amount of time, so that at the cell node there appears a potential as it is indicated for cell node 1 in FIG. 1. Because the cell nodes have effectively the capacitance of the baseemitter junction of the transistor connected thereto the increase of the potential is determined by the time constant of the load resistor of the flipflop transistor, and the capacitance of the cell node. For a quicker charging of the cell nodes the load resistor can be decreased, however, this would automatically have the consequence of higher permanent currents in the unselected state and, therefore, a higher permanent power dissipation and such a higher permanent power dissipation does not go along with a high packing density which is desired in most cases, so that this path cannot be followed for a solution. Additionally, the potential transistion after the termination of the selection phase is very critical to the stability of the storage cell as it involves the risk of an undersired writing of the storage information.

Storage cells of the type shown in FIG. 1 furthermore present specific problems with respect of the symmetry during the writing or reading process. It is again assumed that the left-hand flipflop transistor is conductive, so that cell node 1 is discharged and cell node 2 is charged to almost the operating voltage +V. For rewriting the storage information cell node 1 has to be charged, via bit line BL 1 and the diode connected thereto, to such an extent that the right-hand flipflop transistor is switched on. As the left-hand flipflop transistor, however, is highly conductive at the start, a large part of the current supplied via the bit line flows off via the conductive left-hand flip-flop transistor. The result is that there are required large writing currents which are per se undesired. Owing to the asymmetrical conduction properties of the coupling diodes a discharge of the cell node connected to the nonconductive flip-flop transistor, in the present case of cell node 2, is not possible. On the other hand, the read process in the storage cell shown in FIG. 1 is relatively simple as upon the decrease of the word line potential during the selection phase, the increased current flowing in the storage cell can be easily applied via the bit lines and the diodes connected thereto, and easily determined for detecting the storage contents at the bit lines. If in a circuit of the type shown in FIG. 1 the polarity of the coupling diodes were reversed, the writing process with low currents would be possible, as then the charged cell node would merely have to be discharged, without there being any undesired low-ohmic conduction path, but the read current would have to be drawn out of the storage cell. However, in order to prevent during reading any instability of the storage cell in the standby state an accordingly higher current would have to flow continuously.

Figure 2:
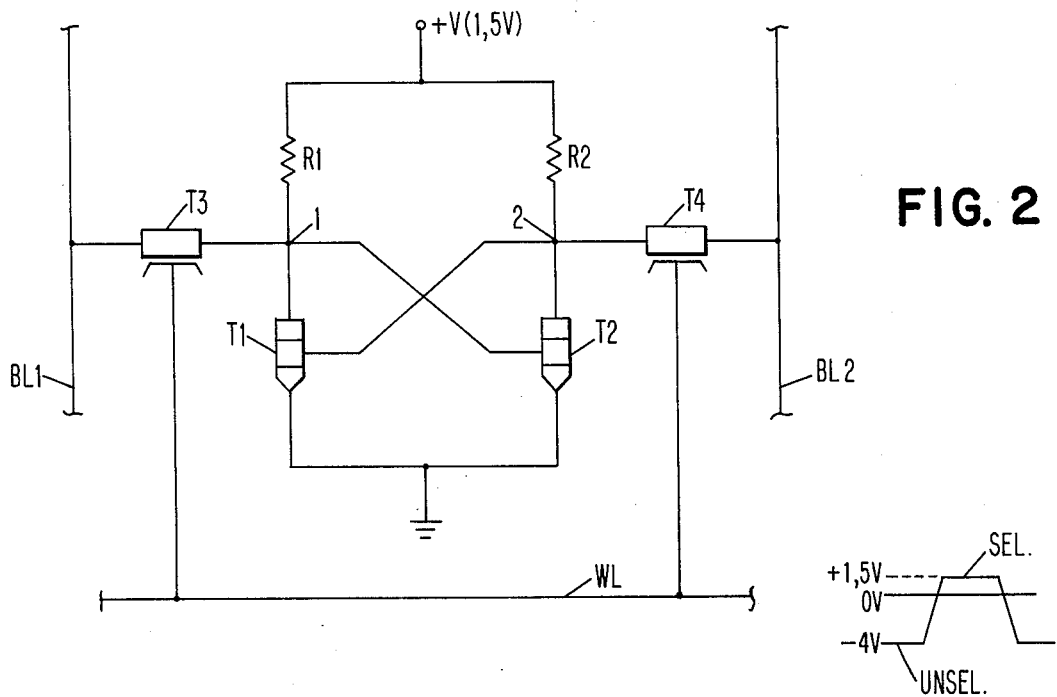
FIG. 2 shows the circuit diagram of an embodiment of the storage cell according to the present invention.

FIG. 2 shows the circuit diagram of an embodiment of a storage cell in accordance with the present invention in which the above specified problems are substantially avoided. The storage cell is again a flipflop circuit similar to that circuit which is shown in FIG. 1. The two active flipflop transistors T1 and T2 are cross coupled in a known manner with respect to their collector and base regions. The emitters of the flipflop transistors are interconnected and applied to a fixed reference voltage, for instance to ground potential. In the load branch of each flipflop transistor, as shown in the embodiment of FIG. 2, resistors R1 or R2 are provided via which the storage cell is connected to operating voltage +V. The storage state of such a storage cell is again represented by the potential at cell nodes 1 and 2. For the load elements of the flipflop transistors, a great variety of embodiments can be provided, for instance not only can ohmic resistors, in a single or double-diffused form or doped stripes, be used but also transistor structures, particularly e.g. lateral PNP bipolar transistors can be used. For load elements all known semiconductor structures, which are compatible with a bipolar process, can generally be used.

Contrary to the above discussed bipolar flipflop storage cells of the type used the addressing of the flipflop of the present invention is carried out in a different manner from that shown in FIG. 1. The coupling of cell nodes 1 and 2 of the flipflop of FIG. 2 to bit lines BL1 and BL2 is carried out via the MESFET's, T3 and T4. The control electrodes of these MESFET's T3 and T4 are connected to each other and to the word line WL. The addressing elements, of the present invention, are generally three-terminal elements compatible with a bipolar process having symmetrical conduction properties which permit the separation of the word and bit selection process from the basic flipflop of the storage cell. It is obvious that thus the above described disadvantages of the pumping of the flipflop potentials connected with each selection discussed in conjunction with FIG. 1 no longer appear. Owing to the symmetrical conduction properties of MESFET's T3 and T4 the charging as well as the discharging of the cell nodes can furthermore be carried out in an uncomplicated manner. This, however, effectively eliminates the above specified problems with respect to the otherwise different read/write characteristics of bipolar flipflop storage circuits.

As already pointed out, and as explained below in detail, it is decisive for the selection of MESFET's as addressing elements that they can be made with bipolar processes which are already of standard usage today. In that connection reference can for instance be made to the fact that for bipolar flipflop storage circuits with diode coupling, Schottky diodes or generally metal-semiconductor junctions are known. So this is not one of the so-called combined manufacturing processes which have to be applied for the simultaneous making of insulated gate field effect transistors and bipolar transistors. These latter processes are available today to a certain extent, but they involve highly complex and critical process steps and controls. As will also be explained below in detail, MESFETs T3 and T4 used as addressing elements are advantageously designed over a buried, relatively highly doped zone so that a new channel control with low and uncritical voltage levels for the word line is obtained.

Junction field effect transistors are preferably selected as the addressing elements which, with regard to their conduction properties, have to represent symmetrical three-terminal elements, and which have to be compatible with a bipolar process. These junction field effect transistors use a gate doping for electrically influencing the channel zone and together with bipolar transistors can be made in a uniform process. Furthermore, corresponding design lateral bipolar transistor structures are possible, etc.

The explanation of the storage cell operation in accordance with FIG. 2 can be restricted to the addressing situation, as the basic flipflop of the storage cell is conventional. In the standby state, i.e. when the storage cell is not selected, the potential of the wordline, e.g. −4V, holds the MESFET's T3 and T4 nonconductive. Thus, the storage flipflop is isolated from the associated bit lines BL1 and BL2. In the selection phase, the word line potential is increased to the value of the supply voltage of about +1.5 V, so that T3 and T4 becomes conductive and thus permit, in an easily obvious manner, the reading-out of the storage information, or the rewriting of the cell, respectively. Reading can be carried out by determining the difference signal between the two cell nodes 1 and 2 by means of a read or sense amplifier, particularly a difference amplifier, connected to the respective bit line pair. For rewriting the storage informtion it is not necessary to charge the discharge cell node connected to the conductive flip-flop transistor instead the charge cell node connected to the respective nonconductive flip-flop transistor is discharged via the associated bit line. Typical voltages are during reading about +1.5 V on both bit lines, and during writing about +1.5 V on the one bit line, with about 0 V simultaneously on the other bit line.

Figure 3A:
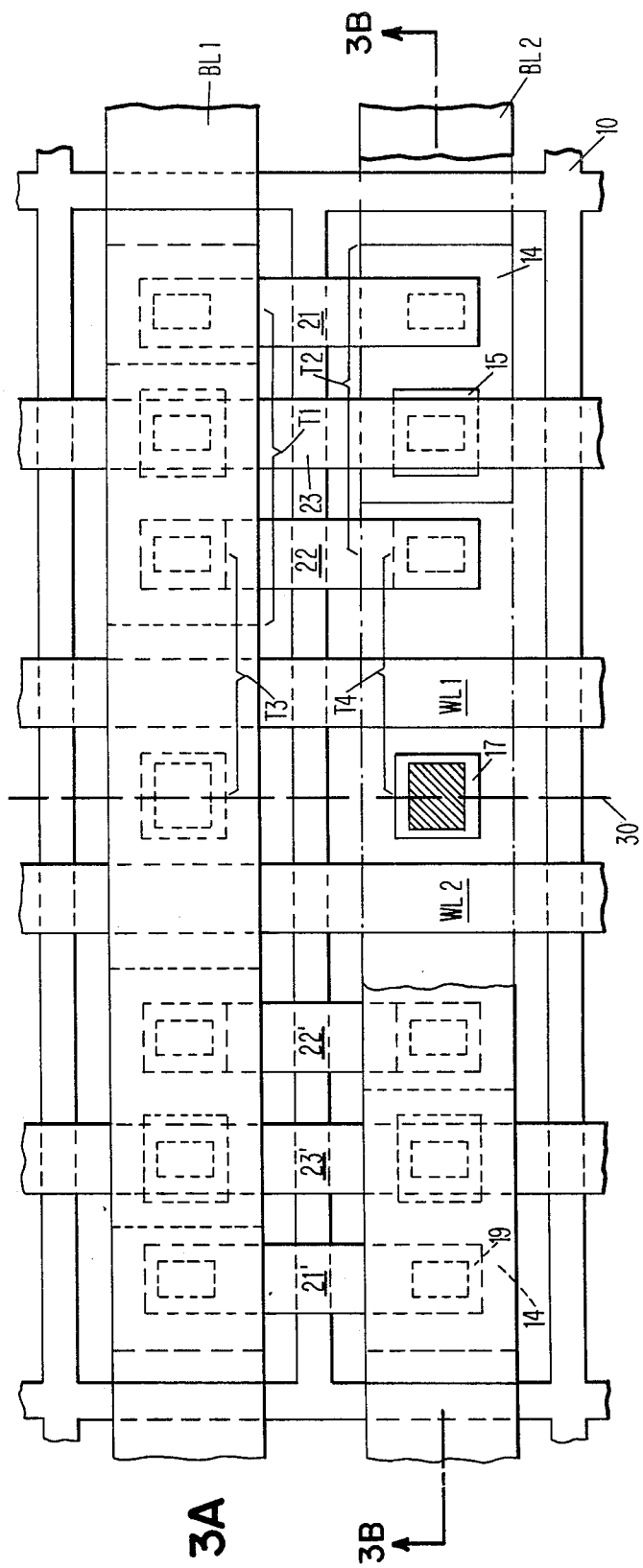
FIG. 3a shows a plan view of an embodiment for an integrated circuit design of two adjacent storage cells according to the present invention.
Figure 3B:
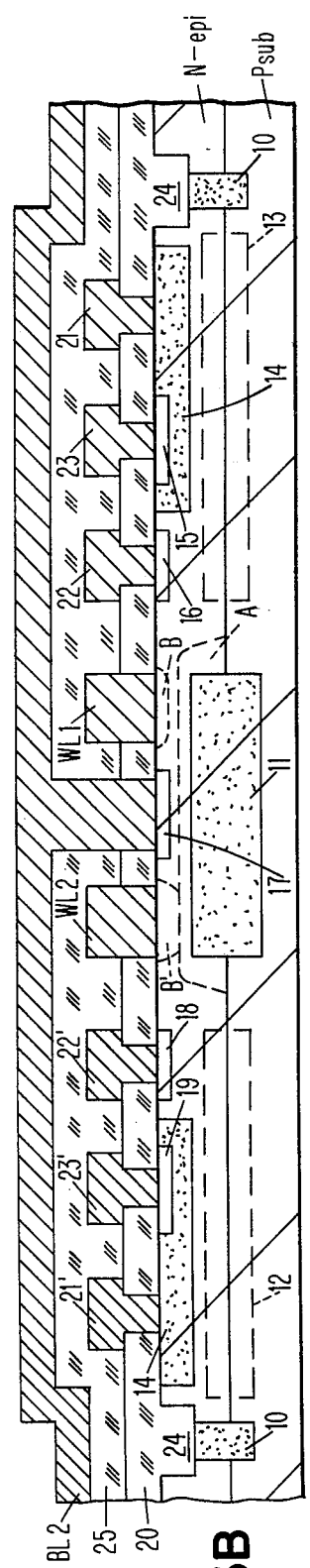
FIG. 3b shows a cross sectional view of the design shown in FIG. 3a taken along the lines 3b.

An advantageous embodiment of the integrated structure of the storage circuit according to the invention is shown in FIGS. 3a in a plan view, as well as in FIG. 3b in a cross section for two adjacent flipflop storage cells. As pointed out, the design of the load element can be performed conventionally in additional, separate isolation regions and is, therefore, not shown.

FIG. 3a is a plan view of the mutual arrangement of the active flipflop and addressing transistors for two flipflop storage cells designed in accordance with the invention. Numeral 30 indicates in accordance with the invention. Numeral 30 indicates the separation line between the active elements of the two cells. Here flipflop transistors T1 and T2 belonging to a storage cell, with the associated addressing elements T3 and T4, are indicated. It is in particular obvious that the flipflop transistors can be combined with the assoicated MESFET's in a surface saving manner.

The starting point is a manufacturing process that will provide bipolar transistors as well as Schottky junctions. For explaining the structure of such a semiconductor storage reference is now also made to the sectional view of FIG. 3b. A P-conductive silicon substrate Psub has a highly doped P+ isolation zone 10 and a channel control zone 11, for the channel control of the MESFET addressing elements, created therein by one common process step. As indicated by dashed lines, N+ zones 12 and 13 can be provided as subcollector zones for the bipolar transistors. On the substrate Psub an N-epitaxial layer N-epi is subsequently formed. The conductivity of the epitaxial layer being selected in such a manner that metal-semiconductor junctions can be obtained. By out diffusion in this as well as in the following process steps the highly doped zones 10, 11, 12, and 13 formed in the substrate expand into the epitaxial layer so that finally they show the form as presented in FIG. 3b. By means of a suitable doping process, e.g. by diffusion and/or ion implantation, the P base regions 14 for the bipolar flipflop transistors, as well as the N+ regions 15, 16, 17, 18, and 19 are provided subsequently. Regions 15 or 19 respectively, represent the emitter regions of one respective bipolar flipflop transistor, whereas regions 16 or 18 form the collector contacts. Owing to the relatively high doping degree of the collector contacts 16 or 18 it is assured that, at these points no metal-semiconductor junction for forming a Schottky diode will be created. Finally, N+ region 17 represents the common source for two MESFET's whose drains are on the one hand the N+ region 16 or on the other the N+ region 18.

On the surface of the thus structurized semiconductor body a two layer metallization is provided, the first metallization layer being isolated from the semiconductor body by a thin layer 20 of preferably thermal silicon dioxide. In this first metallization layer the collector base connections of the active flipflop transistors lines 21, 22, or 21', 22' are designed with corresponding contact openings to the semiconductor body being provided. The emitter connections of the flipflop transistors take place via conductive lines 23 or 23', respectively. In this first metallization plane, word lines WL1 and WL2 for the two storage cells shown are also depicted. These lines, the control electrodes of the MESFET's provided for addressing a storage cell. To a metal-semiconductor junction, for creating a Schottky gate field effect transistor a metal has to be selected for the word lines adapted to the doping level of the epitaxial layer N-epi such that rectifying jucntions form at the contact between the metal lines WL1, WL2, and the epitaxial layer N-epi. For obtaining such metal-semiconductor junctions a plurality of metal-semiconductor combinations are known. Where suitable aluminum semiconductor contact is considered to be particularly advantageous especially when the semiconductor material is of relatively low doping.

The epitaxial layer N-epi is thinned over the isolation zone 10 to form a groove 24 and layer 20 covering the semiconductor body on its surface, is extended over isolation zones 10 and into the grooves 24 in the semiconductor body, so that a complete isolation of predetermined semiconductor regions in the semiconductor body is achieved. It is to be noted the control electrodes of the two MESFET's T3 and T4, as shown in FIG. 3a, are so isolated. This manner of isolation represents a mixed form, in that close to the surface it is a dielectric isolation, and further to the inside of the semiconductor body a nonconductive P/N junction isolation. This combined dielectric P/N junction isolation suppresses the highly undesired parasitic currents close to the surface. This isolation method is known per se, but is new with regard to the isolation of MESFET's.

Over the first metallization layer there is a second metallization layer for bit lines BL1 and BL2 which is separated from the first layer by a second isolation layer 25, e.g. of silicon dioxide applied by means of cathode sputtering. The bit line metallization contacts the source 17, of the MESFET's used as addressing elements.

The MESFET's used in the invention are modified Schottky gate field effect transistors. Considering for instance the MESFET whose gate is formed by word line WL1, source 17 and drain 16 has a conductive channel which is limited by depletion region B, represented by dashed lines, formed under word line WL1, and by depletion region A formed around P+ zone 11. The expansion of the lower depletion region A can be freely selected by the substrate biasing, whereas the expansion of depletion region B is controlled by the gate potential word line WL1. It is obvious that depletion region B under the word line WL1 contacts depletion region A at a negative biasing of word line WL1 relative to the eptiaxial layer N-epi, and that it is thus renders the MESFET nonconductive. Owing to the additional P+ zone 11 provided for the MESFET only a small expansion of depletion zone B is required for making this channel nonconductive. This case is shown under word line WL2 by the depletion region B'. which is touching depletion region A.

A bipolar flipflop storage cell is thus presented which permits the building of extensive storage arrangements where the speed advantage of the bipolar transistors, particularly for the decoding circuits, is maintained without having the disadvantage of the pumping of the potential of the entire storage cell(s).

The present invention also has improved stability and write/read properties over circuits using non-symmetrical bit line coupling devices.

The present invention by using such MESFET's as bit line coupling devices achieves low writing currents, uncritical switching levels for the word selection, as welll as, high speed read and write times. Finally, the present invention can be made with conventional bipolar processes, the necessary semiconductor surface required being easily comparable with that of diode or transistor coupled storage cells.

Although a preferred embodiment has been described herein it should be obvious to those skilled in the art that the invention may be carried out in various ways and may take various forms of embodiments over those described above. Accordingly, it is understood that the present invention is not limited by the details of the foregoing description but is defined by the following claims.

We claim:
1. A memory circuit comprising,
  a word line,
  first and second bit lines,
  a memory cell comprising a pair of cross coupled bipolar transistors, and
  first and second symmetrically conductive three-terminal semiconductor devices having first and second current carrying electrodes and a current control electrode,
  the first and second electrodes of said first device intercoupling said cell to said first bit line,
  the first and second electrodes of said second device intercoupling said cell to said second bit line, and
  each control electrode of each of said first and second devices coupling to said word line.

2. The memory circuit of claim 1 wherein each of said symmetrically conductive devices comprises a field effect transistor having source, drain, and gate electrodes,
  each transistor having its source and drain circuit coupled between a respective bit line and said memory cell and its gate electrode coupled to said word line.

3. The circuit of claim 2 wherein said transistors are Schottky gate field effect transistors.

4. The circuit of claim 2 wherein said field effect transistors are junction field effect transistors.

5. A memory system comprising,
  a word line,
  a pair of bit lines, and
  storage cells coupled between said pair of bit lines, each of said storage cells comprising,
  a bistable circuit including a pair of cross coupled bipolar transistors having resistor collector loads and having each of their collectors coupled to a respective one of said pair of bit lines by a respective Schottky gate field effect transistor having a source, a drain, and a gate,
  said source and drain circuit of each respective field effect transistor intercoupling said memory cell to a respective one of said pair of bit lines,
  said gate electrode of each respective field effect transistor being coupled to said word line.

6. A semiconductor integrated circuit comprising, a body of semiconductor material, isolation means electrically separating said body into electrically distinct regions, a base, an emitter and a collector diffusion in each of said regions to form a bipolar transistor in each of said regions, conductive means interconnecting the base and collector contacts in one of said regions to the collector and base contacts respectively in the order of said regions to form cross coupled bipolar transistors, conductive means interconnecting each of said emitter diffusions, a source and a drain diffusion forming a source drain circuit with a conductive channel therebetween in each of said regions, said collector in each region being connected to one end of the source drain circuit in the same region, a metallic contact lying between each of said source and drain diffusions and forming a Schottky barrier with said body, and means for biasing each of said metallic contacts to control the channels lying between said source and said drain diffusions.

7. The circuit of claim 6 wherein said isolation means comprises an isolation diffusion in said body and an oxide deposition extending into said body over said isolation diffusion.

8. The circuit of claim 6 wherein said body is N-type semiconductor material and said metallic contact forming said Schottky barrier is aluminum.

* * * * *